United States Patent [19]

Hoehn

[11] Patent Number: 5,090,036
[45] Date of Patent: Feb. 18, 1992

[54] TWO-PHASE-CLOCKED SHIFT REGISTER IS BIPOLAR TECHNOLOGY

[75] Inventor: Wolfgang Hoehn, Märgen, Fed. Rep. of Germany

[73] Assignee: Deutsche ITT Industries GmbH, Freiburg, Fed. Rep. of Germany

[21] Appl. No.: 553,022

[22] Filed: Jul. 16, 1990

[30] Foreign Application Priority Data

Aug. 16, 1989 [EP] European Pat. Off. ......... 89 11 5059

[51] Int. Cl.[5] ............. G11C 11/41; G11C 5/06; H03K 23/42
[52] U.S. Cl. ............................. 377/78; 377/81; 377/67
[58] Field of Search .............. 377/67, 81, 104, 115, 377/78

[56] References Cited

U.S. PATENT DOCUMENTS

| | | | |
|---|---|---|---|
| 3,174,106 | 3/1965 | Urban | 377/78 |
| 3,851,187 | 11/1974 | Pao et al. | 377/81 |
| 3,993,918 | 11/1976 | Sinclair | 377/115 |
| 4,258,273 | 3/1981 | Straznicky et al. | 377/81 |

FOREIGN PATENT DOCUMENTS 3302248 7/1984 Fed. Rep. of Germany.
1570069 2/1971 Switzerland.

OTHER PUBLICATIONS

IBM TECHNICAL DISCLOSURE BULLETIN, Vol. 15, No. 2, Jul. 1972; "Charge Sense and Transfer Scheme"; H. H. Berger and S. K. Wiedmann.

*Primary Examiner*—John S. Heyman
*Attorney, Agent, or Firm*—Thomas L. Peterson

[57] ABSTRACT

A shift register is disclosed in which an n-stage shift-register chain (sr) consists of 2n series-connected, like basic cells (zi) which are driven in antiphase by a first and a second shift clock (C1, C2) from a clock generator (g). The nonoverlap range of the two shift clocks is temperature- and frequency-stable, so that the shift register can be used within a wide frequency and temperature range. Frequency adaptation is accomplished simply by changing resistance values.

20 Claims, 3 Drawing Sheets

TWO-PHASE-CLOCKED SHIFT REGISTER IS BIPOLAR TECHNOLOGY

FIELD OF INVENTION

The present invention relates to a two-phaseclocked shift register in bipolar technology.

BACKGROUND OF THE INVENTION

A bipolar shift register is disclosed, for example, in German OffenLegungsschrift DE-A 33 02 248, in which an n-stage shift-register chain consists of 2n series-connected basic cells connected alternately to a first shift clock and a nonoverlapping second shift clock. Each of the n shift-register stages is formed by two successive basic cells. Through the use of nonoverlapping shift clocks, the data transfer into each of the shift-register stages is separated in time from the data transfer out of the stage by temporary storage. The two nonoverlapping shift clocks are generated in a clock generator from the two output signals of a differential amplifier fed with a square-wave signal. The basic cell used consists of a dual-emitter npn-transistor pair whose base and collector terminals are cross-coupled, and whose two additional emitters provide the data signal in antiphase.

The object of the invention as claimed is to provide a two-phase-clocked shift register in bipolar technology having a wide frequency range and a neutral temperature response whose entire contents can be transferred in parallel into a latch by means of a latch clock and are available there as a data word for an arbitrary period of time.

SUMMARY OF THE INVENTION

In accordance with the present invention, a two-phase-controlled shift register in bipolar technology comprises a clock generator providing first and second shift clocks, a latch clock, and an n-stage shift register chain having 2n series-connected odd- and even- numbered cells each having a clock input and respective pairs of input and output terminals for antiphase data, and n latch cells, wherein each stage is formed by an odd-numbered cell clocked by the first shift clock, an even-numbered cell clocked by the second shift clock, and a latch cell clocked by the latch clock, the output terminals of the odd-numbered cell being connected to the input of the even-numbered cell and the output of the latter being connected to the input of the latch cell and to the input of the odd-numbered cell of the next stage, and wherein all cells contain a current bank, first and second cross-coupled npn transistors connected to the current bank, and third and fourth npn transistors coupled between the input and output terminals for the cell and to the first and second transistors. The clock generator includes a differential transistor pair to which a square wave signal is applied for providing the first and second shift clock outputs, and which are coupled to a ground terminal through a respective load resistors in series with diode-connected transistors.

One advantage of the invention is that the entire shift-register arrangement can be adapted to a wide frequency range simply by changing the values of two resistors. The ambient temperature has almost no effect on the overlap period. Thus, the shift register functions over a wide temperature range without the clock rate having to be reduced for safety reasons. Another advantage is that by taking steps in the layout, the layout geometry can be linearly scaled down because the sensitivity to higher supply voltages and the parasitic effects depending thereon are reduced. This ensures, for example, that the shift register operates properly even with a technology in which a collector-emitter cutoff voltage higher than 40V is permissible for other integrated devices.

BRIEF DESCRIPTION OF THE DRAWINGS

The invention and further advantages thereof will now be explained in greater detail with reference to the accompanying drawings, in which.

DETAILED DESCRIPTION OF THE PREFERRED EMBODIMENTS

Figure 1:
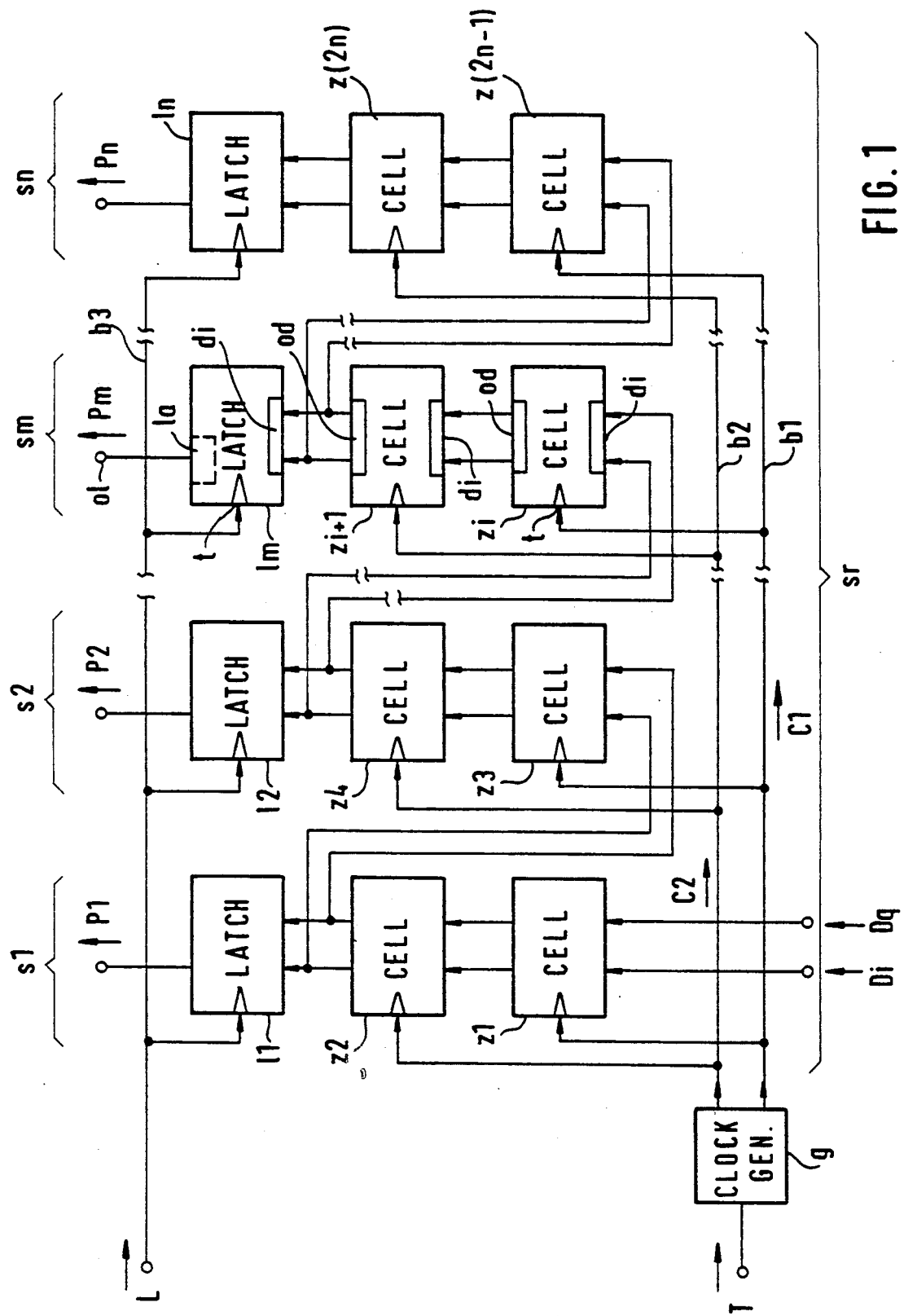
FIG. 1 is a block diagram of an n-stage shift register with n latches and a clock generator for generating the nonoverlapping two-phase clock.

In the block diagram of FIG. 1, 2n basic cells $z1, z2, z3, z4, \ldots; zi, zi+1, \ldots, z(2n-1), z(2n)$ are connected in cascade. The first basic cell $z1$ is fed with an antiphase data pair $Di, Dq$. Each of the basic cells $zi$ is a statically clocked storage element, e.g., an RS flip-flop with cross-coupled transistors. All odd-numbered basic cells $z1, z3, zi, \ldots z(2n-1)$ have the clock inputs t connected to a first shift clock C1, which is applied to a first clock line b1 by a clock generator g. All other basic cells $z2, z4, \ldots, zi+1, \ldots, z(2n)$, namely the even-numbered ones, have their clock inputs t connected to a second shift clock C2, which is applied from the clock generator g to a second clock line b2. The input of the clock generator g is fed with a square-wave signal T.

Each shift-register stage is formed by a combination of one odd-numbered basic cell and one directly succeeding even-numbered basic cell $z1, z2; z3, z4; \ldots; zi, zi+1; \ldots; z(2n-1), z(2n)$, so that a shift register with n stages $s1, s2, \ldots, sm, \ldots, sn$ is formed from the 2n basic cells of the shift-register chain sr. After every clock period, the entire shift-register contents have been shifted by one stage.

Figure 2:
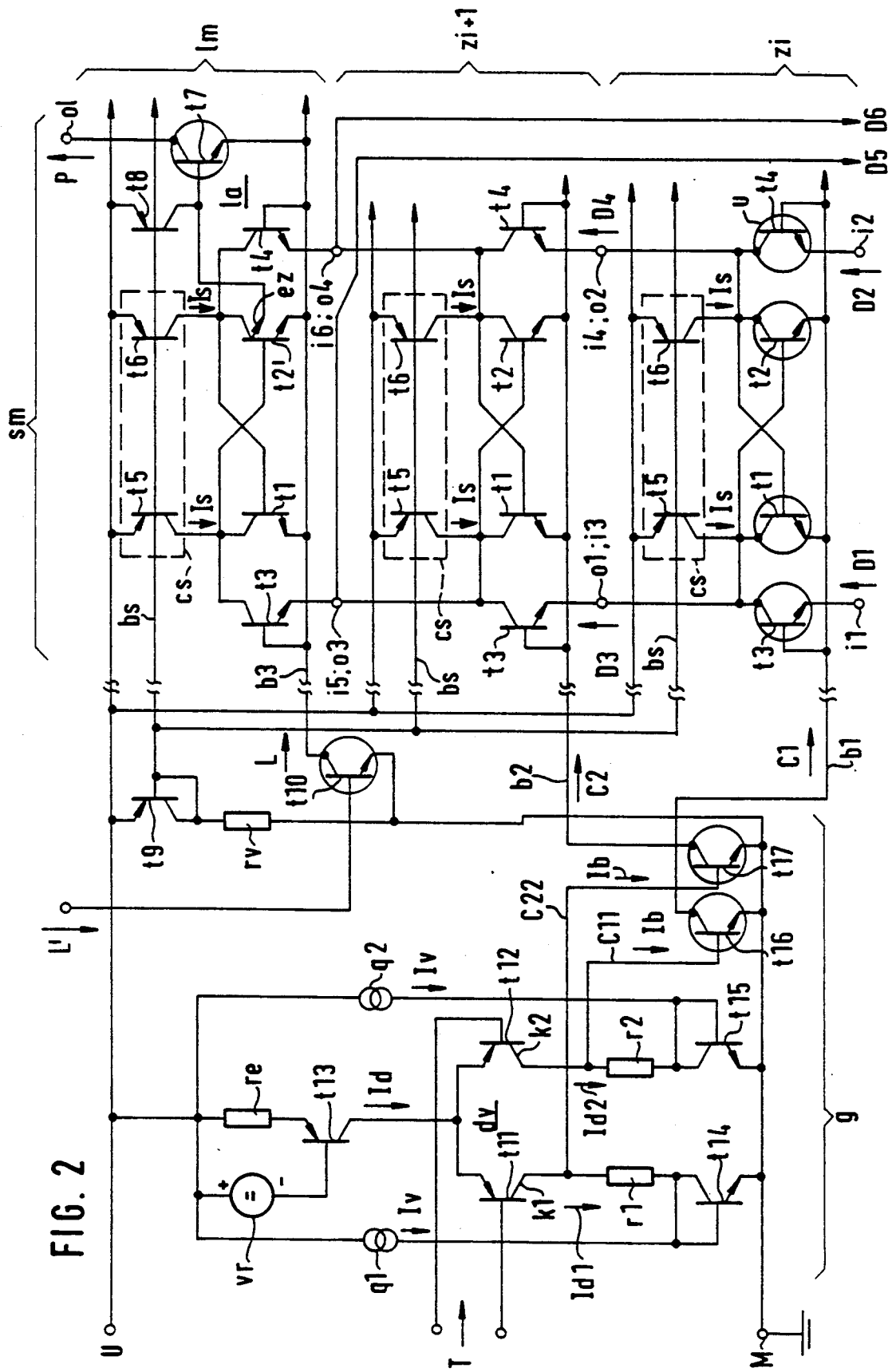
FIG. 2 is a circuit diagram of a preferred embodiment of the clock generator and one of the n shift-register stages.

Each basic cell $zi$ of the shift-register chain sr has an antiphase data input di and an antiphase data output od, with the directly succeeding basic cell $zi+1$ having its antiphase data input di connected directly to the antiphase data output od of the preceding basic cell $zi$. The antiphase data output od of each even-numbered basic cell $zi+1$ is also fed to the antiphase data input di of a latch $lm$, which is controlled by a latch clock L. Each shift-register stage $s1, s2, \ldots, sm, \ldots, sn$ has one latch $11, 12, \ldots, 1m, \ldots, 1n$ associated with it which includes an output stage 1a from which the respective data signal $P1, P2, \ldots, Pm, \ldots, Pn$ is obtainable. In FIGS. 1 and 2, only the output stages 1a for a single data phase are shown for simplicity. If antiphase data signals are to be coupled out, the output stage 1a will be supplemented by a second, symmetrically connected output stage.

FIG. 2 is a circuit diagram of a preferred embodiment of the clock generator g and one of the n shift-register stages sm. Each shift-register stage sm contains two series-connected basic cells zi, zi+1 and one latch 1m connected to the latter of the two basic cells. All three units of the shift-register stage contain an RS flip-flop as an essential subcircuit, which consists of a cross-coupled npn-transistor pair, namely the first and second transistors t1, t2, both of a first type, and third and fourth transistors, t3, t4, also of the first type. The collectors of the first and second transistors t1, t2, are fed from a current bank cs, namely a pnp current bank, containing two current sources in the form of fifth and sixth transistors t5, t6 of a second type, with the base terminals of all current-source transistors interconnected via a common base lead bs. The fifth transistor t5 and the sixth transistor t6 feed the collectors of the first transistor t1 and the second transistor t2, respectively. The output current of the respective current bank cs is the current-bank current (=Is).

Logic reversal of the cross-coupled transistor pair t1, t2 is accomplished by means of the third and fourth transistors t3, t4, whose collectors are connected with the collectors of the first transistor t1 and the second transistor t2, respectively, to realize an OR function. The base terminals of the third and fourth transistors t3, t4 and the emitter terminals of the first and second transistors t1, t2 are connected to a clock line. In the basic cell shown, zi, this is the first clock line b1, via which the first shift clock Cl is applied to the basic cell zi.

Figure 3:
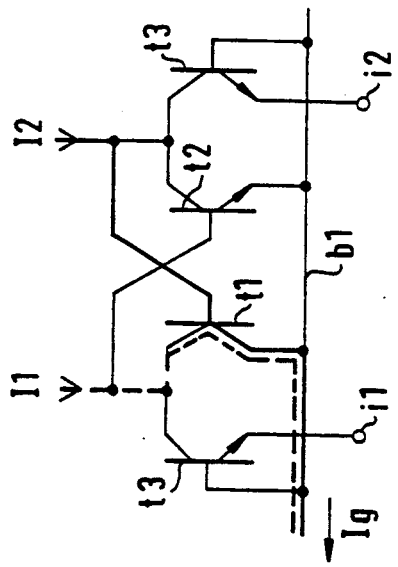
FIG. 3 shows the current paths in the basic cell during data transfer into the cell.

The first shift clock C1 is formed by a npn switching transistor, namely the sixteenth transistor t16 of the first type, whose emitter is tied to a common ground terminal M and whose collector is connected to the first clock line b1. The base of the npn switching transistor t16 is driven from the clock generator g with a square-wave first signal cf derived from the square-wave signal T. During the ON period of the npn switching transistor t16 the first clock line b1 is thus connected to the potential of the ground terminal M via a low-impedance path. During the OFF period of the npn switching transistor t16, the first clock line b1 remains in a dead "floating condition". In FIG. 3, it will be shown that in this "floating condition", the current-bank current Is nevertheless causes a current to flow on the first clock line b1, namely via the base-emitter paths of the first and third transistors t1, t3. Only during the "floating condition" can the respective basic cell accept data from the preceding basic cell. When the npn switching transistor t16 is on, the data content of the basic cell remains stable—the basic cell is in a "latched condition".

The antiphase data input di of the basic cell zi of FIG. 2 is formed by the emitters of the third and fourth transistors t3, t4, which emitters are connected to a first input terminal i1 and a second input terminal i2, respectively. The first and second input terminals i1, i2 are fed with the first data input signal D1 and the second (antiphase) data input signal D2, respectively. The antiphase data output od of the basic cell is formed by a first output terminal o1 and a second output terminal o2. The first output terminal o1 is connected to the collectors of the first and third transistors t1, t3, and the second output terminal o2 to the collectors of the second and fourth transistors t2, t4. The first and second output terminals o1, o2 provide the third data output signal D3 and the antiphase fourth data output signal D4, respectively, of the basic cell zi.

In FIG. 2, the first and second output terminals o1, o2 of the basic cell zi are identical with the input terminals i3, i4 of the succeeding basic cell, which are connected to the emitters of the associated transistors t3, t4 for driving this basic cell zi+1. The shift clock of this basic cell zi+1 is applied to the latter over a second clock line b2, which is controlled in antiphase and nonoverlappingly with the first shift clock C1 by an additional npn switching transistor, namely the seventeenth transistor t17 of the first type, thus forming the second shift clock C2. The base of the seventeenth transistor t17 is driven by a second signal C22, which is generated in the clock generator g.

The antiphase data output od of this basic cell zi+1, i.e., an even-numbered cell, is formed by the third and fourth output terminals o3, o4, which provide the fifth data output signal D5 and the antiphase sixth data output signal D6, respectively, for the succeeding shift-register stage.

In FIG. 2, the third and fourth output terminals o3, o4 are identical with the fifth terminal i5 and the sixth terminal i6, respectively, of the antiphase data input di of the latch.

The latch 1m includes a complete basic cell similar to that of the basic cell zi and an output stage 1a for the data signal to be fed out, P. In most cases, it will be sufficient to take this data signal P as a single-phase signal from the second transistor t2' of the basic cell zi. To obtain the data signal P in two-phase representation, the latch 1m must be supplemented by an additional output stage at the first transistor t1 which is symmetrical with respect to the output stage 1a.

The second transistor t2' of the basic cell of the latch cell in the latch 1m is a dual-emitter transistor. The additional emitter ez is connected to the base of a seventh transistor t7 of the first type, whose emitter is connected to the clock line, namely the latch clock line b3, of the latch 1m. The collector of this seventh transistor t7 is coupled to the latch output terminal o1, from which the data signal P is obtainable. The base current of the seventh transistor t7 is the collector current of an eighth transistor t8 of the second type, whose base is coupled to the common base lead bs in parallel with the fifth and sixth transistors t5, t6 of the current bank cs. In the layout, the effective collector size of this eighth transistor t8 is chosen so that its collector current is about one fifth of the current-bank current Is. This is sufficient to drive the base of the seventh transistor t7 is any case. The current can also be reduced by taking other measures, such as emitter negative feedback. The output stage 1a thus comprises the seventh and eighth transistors t7, t8 and the additional emitter ez the second transistor t2' of the basic cell of the latch cell.

The third clock line b3, carrying the latch clock L, is controlled by a third npn switching transistor, namely the tenth transistor t10 of the first type, whose base is fed with a latch signal L'. During the acceptance phase, the latch clock L must be opposite in phase to and nonoverlapping with the second shift clock C2. It can thus be in synchronism or even identical with the first shift clock C1.

The clock generator g in FIG. 2 derives the two antiphase shift clocks C1, C2 from an antiphase square-wave signal T by means of a differential amplifier dv and further subcircuits. The differential amplifier dv contains a pnp-transistor pair, namely eleventh and twelfth transistors t11, t12 of the second type, whose common emitter terminal is fed from a constant-current source vr, re, t13. The constant-current source consists of a thirteenth transistor t13 of the second type having its emitter and base connected to the positive supply voltage U via an emitter resistor re and a reference-voltage source vr, respectively. The reference-voltage source vr is, for example, one of the well-known bankgap circuits with predeterminable temperature response, so that the output current Id of the constant-current source becomes temperature-independent.

Figure 5:
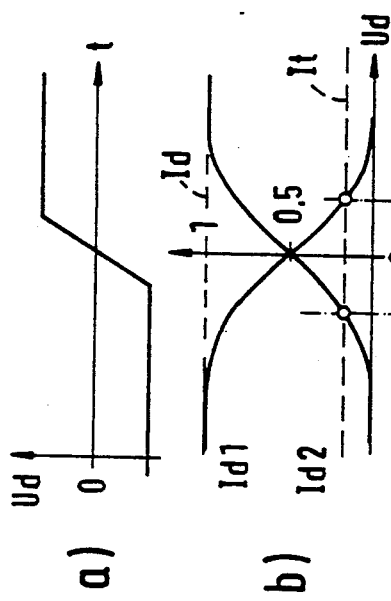
FIG. 5a–5d show a few signal waveforms serving to explain the generation of the two-phase clock.
Figure 5:
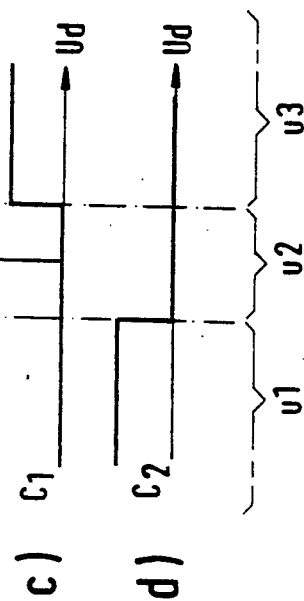

The square-wave signal T causes the output current of the constant-current source, namely the constant-current-source current Id, to be divided via the differential amplifier dv, i.e., the eleventh and twelfth transistors t11, t12, into a first difference current Id1 and a second difference current Id2; in FIG. 5, this division is shown graphically as a function of the difference voltage Ud.

To generate the antiphase clock signals, in the simplest case (no separate illustration necessary), the collectors k1, k2 of the eleventh and twelfth transistors t11, t12 are connected to the ground terminal M through a load resistor. They are also connected to the bases of the sixteenth and seventeenth transistors t16, 17, respectively, namely the two npn switching transistors for the two shift clocks C1, C2. The values of the two load resistors determine the nonoverlap time of the two shift clocks C1, C2, but also the depletion times of the npn switching transistors. If during current transfer, the collector k1, for example, produces across its load resistor a voltage drop which is greater than the base-emitter threshold voltage of the sixteenth transistor t16, i.e., about 0.6 V, this transistor will turn on and the first clock line b1 will be connected nearly to the potential of the ground terminal M via low-impedance path. A disadvantage of this arrangement is that the base-emitter threshold voltage of the npn switching transistor is temperature-dependent, so that the nonoverlap range and, hence, the nonoverlap time are also temperature-dependent.

According to the invention, this disadvantage is eliminated by the two diode-connected transistors of the first type, namely the fourteenth transistor t14 and the fifteenth transistor t15. In the embodiment of FIG. 2, the common base-collector terminal of the fourteenth transistor t14 is connected via a first resistor r1 to the collector k1 of the eleventh transistor t11. In addition, the common base-collector terminal is connected to the positive supply voltage U via a first bias current source q1, which feeds a constant bias current Iv into the diode. The emitter of the fourteenth transistor t14 is connected to the ground terminal M. Similarly, the common base-collector terminal of the fifteenth transistor t15 is connected via a second resistor r2 to the collector k2 of the twelfth transistor t12 and fed via a second bias current source q2 with a constant bias current Iv which is equal to the bias current Iv from the first bias current source q1.

The bias current Iv is less than the constant-current-source current Id by a factor of about 10 to 1000. The constant-current-source current Id is advantageously chosen so that its value is about twice to five times that of the necessary base current (=Ib) of either of the two npn switching transistors t16, t17. The necessary base current Ib follows from the number n of shift-register stages, the value of the current-bank current (=IS), and the DC gain (=B) in the switched mode according to the following equation:

$$Ib = 2nIs/B.$$

The constant-current-source current Id is thus chosen according to the following rule:

4nIs/B less than/equal to Id less than/equal to 10nIs/B

The bias current Iv keeps the diode voltage of the fourteenth and fifteenth transistors t14, t15 at a value slightly below the base-emitter threshold voltage of the two npn switching transistors t16, t17. The temperature dependencies of the diode voltage and the base-emitter threshold voltage of the npn switching transistors are nearly equal. As is well known, the temperature coefficient of this difference voltage is only 3.3 per mill per degree kelvin. This value can even be improved by suitable adjustment of the reference-voltage source vr.

The use of the diodes and the low-value resistors r1, r2 has an added advantage in that it reduces the Miller effect at the two npn switching transistors t16, t17 in the cutoff region, where their base-emitter paths are still of very high impedance. The low-value load resistor and the reduction of swing also have a very favourable effect on the high-frequency characteristics of the differential amplifier dv by reducing the disadvantageous Miller effect in this amplifier. In FIG. 2, the current bank cs is simply connected to a ninth transistor t9 of the second type which is connected as a diode and whose common base-collector terminal is connected both to the common base lead bs of all current banks cs and through a series resistor rv to the ground terminal M.

FIG. 3 shows the current paths in the basic cell during data transfer into the cell. This is the state in which the associated clock line is in a floating condition, with the shift clock being at the upper voltage level. In the example shown, therefore, the first clock line b1 is in a floating condition and the first input terminal i1 has a data input signal applied to it which pulls this terminal in the direction of the ground terminal M. Thus, a data current Ip flows at this terminal. The second input terminal i2 is fed with the antiphase data input signal, so that this terminal is dead. The data current Ip forces the flip-flop consisting of the first and second transistors t1, t2 into the desired logic state.

The current supplied form the current bank cs to the collectors of the first and third transistors t1, t3 is the first current-bank current I1, which divides into a first component current I11, which flows through the collector of the firs transistor t1, and a second component current I13, which flows through the collector of the third transistor t3. The first component current I11 flows through the collector-emitter path of the first transistor t1 into the first clock line b1 and thence through the base-emitter path of the third transistor t3 into the first input terminal i1. the second component current I13 flows through the collector-emitter path of the third transistor t3 directly into the first input terminal i1.

In the state assumed above, the second and fourth transistors t2, t4, are off, so that the second current-bank current i2, which is supplied to the collectors of the second and fourth transistors t2, t4, cannot be accepted by the latter. The second current-bank current i2 therefore flows through the base-emitter path of the first transistor t1 into the first clock line b1 and thence through the base-emitter path of the third transistor t3 into the first input terminal i1.

Figure 4:
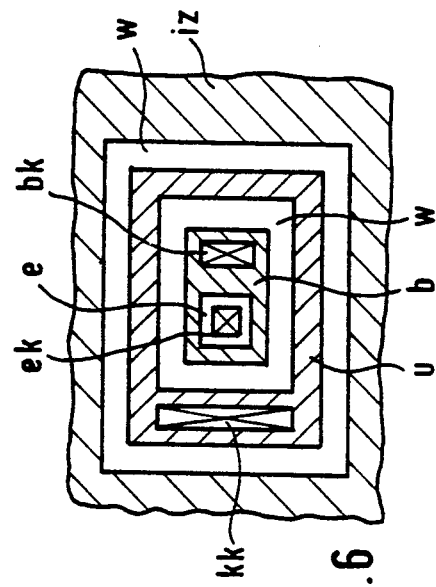
FIG. 4 shows the current paths in the basic cell in the latched condition.

FIG. 4 shows the state in which the clock line is switched through by the associated npn switching transistor, i.e., in which it is nearly at the potential of the ground terminal M. In this state, the preceding basic cell (not shown in FIG. 4) is dead, so that no current can be taken via the two data lines connected to the two input terminals i1, i2. The first current-bank current I1 thus flows through the conducting collector-emitter path of the first transistor t1 into the first clock line b1. The second current-bank current I2 flows though the base-emitter path of the first transistor t1 into the first clock line b1. The total current Ig of the first clock line b1 is switched to the ground terminal M by the npn switching transistor (not shown).

FIG. 5 shows a few signal waveforms to explain the two-phase-clock generation in the clock generator g. The difference signal Ud, which represents the effective difference voltage at the differential amplifier dv, corresponds to the square-wave signal T. The diagram of FIG. 5a shows that this difference voltage Ud changes from one state to the other in a finite time period.

The diagram of FIG. 5b shows how the constant-current-source current Id is divided into a first component current Id1 and a second component current Id2 as a function of the difference voltage Ud. The linear representation corresponds to the well-known current division in bipolar differential amplifiers. FIG. 5b also shows the threshold current It, at which the respective component current suffices to produce such a large voltage drop across its resistor-diode path r1, t14; r2, t15 that the subsequent npn switching transistor is turned on. The nonoverlap range can thus be changed by suitable choice of this threshold current It. If the circuit is designed so that the difference voltage Ud, the two component currents Id1, Id2, and the threshold current It remain constant, the nonoverlap range will not change, either. The nonoverlap range depends on the edge steepness of the difference voltage Ud, of course. The shorter the duration of the edge, the smaller the nonoverlap range.

The diagrams FIGS. 5c and 5d show the voltage levels of the first and second shift clocks C1, C2, respectively, as a function of the difference voltage Ud. The respective switching point is determined by the intersection of the threshold current It and the first or second component current Id1, Id2. In the example shown, it can be seen that during the first time interval u1, only the second shift clock C2 is in a floating condition, i.e., at a high potential. In the second time interval u2, the nonoverlap range, both shift clocks C1, C2 are at a low potential, i.e., in the latched condition. In the third time interval u3, only the first shift clock C1 is in a floating condition, i.e., at a high potential.

Figure 6:
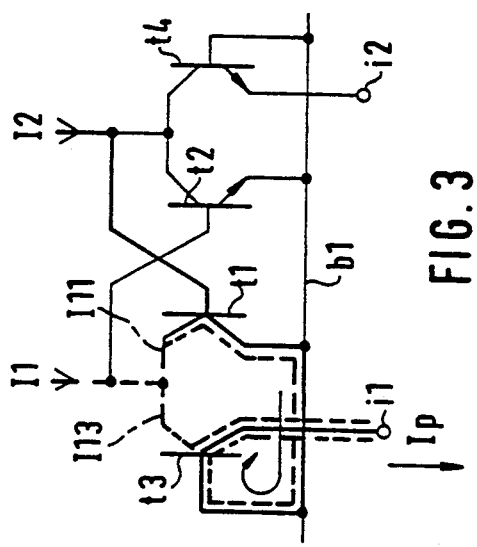
FIG. 6 shows the layout of a saturation-proof npn transistor in a schematic plan view.

In FIG. 6, the layout of an npn transistor, i.e., a transistor of the first type, is shown schematically in a plan view. As shown in FIGS. 3 and 4, these transistors operate partly in a saturation region in which the DC gain B drops to the value The hard saturation of these transistors involves the risk of parasitic currents. Since the latter flow in a lateral rather than a vertical direction because of the buried layer, the base region b is surrounded by a low-impedance annular region u of $n^+$-type material which lies within and contacts the collector well w. lateral currents originating from the base region b are thus intercepted and removed via the collector contact kk.

The plan view of FIG. 6 shows the emitter region e with the emitter contact ek, the base region b with the base contact bk, and the collector well w, which is embedded in the insulating region iz of $p^+$-type material. Low-impedance contact to the collector is made via the buried layer of $n^+$-type material and the annular region u, which is let into the surface of the collector well. In the basic cell zi and the output stage 1a of FIG. 2, this annular region is shown schematically as a ring around those transistors of the first type which go into saturation.

The shift register is adapted to different frequencies simply by changing the emitter resistor re in the clock generator and the series resistor rv in the control section of the current bank cs. A higher clock rates, the switching currents are increased by decreasing the values of these resistors, so that the shifting operation is completed more rapidly. If the edge of the difference voltage Ud is steep enough, the nonoverlapping of the two shift clocks C1, C2 will be preserved.

What is claimed is:

1. Two-phase-controlled shift register in bipolar technology, comprising:
   a clock generator which provides a first shift clock and a second shift clock, said clock generator including an emitter coupled differential amplifier for providing said first shift clock at a first output and said second shift clock at a second output;
   an n-stage shift register chain having 2n series-connected cells defined as alternately odd- and even-numbered cells, wherein each cell has a clock input, a pair of input terminals for receiving antiphase data input, and a pair of output terminals for providing antiphase data output, and n latch cells each having a latch-clock input, a pair of input terminals for receiving antiphase data input, and an output stage for providing a data output based upon at least one of said antiphase data input;
   wherein each stage of said n-stage shift register chain is formed by an odd-numbered cell, an even-numbered cell, and a latch cell, the odd-numbered cell having said first shift clock applied to its clock input and its output terminals connected to the input terminals of the even-numbered cell, the even numbered cell having said second shift clock applied to its clock input and its output terminals connected to the input terminals of the latch cell and to the input terminals of the odd-numbered cell of the next stage in sequence of said n-stage shift register chain, and the latch cell having said latch clock applied to its latch-clock input for providing the data output latched therein via its output stage; and
   wherein each of the odd-numbered, even-numbered, and latch cells of said n stages of said shift register chain is formed by a basic cell circuit including a current bank for providing a current-bank current Is at a pair of output terminals thereof, a first transistor and a second transistor of a first type having their emitter terminals coupled together and each having its collector terminal connected to the base terminal of the respective other transistor and to a respective output terminal of the current bank, and a third transistor and a fourth transistor of the first type having their emitter terminals coupled to the respective pair of input terminals for the cell and their collector terminals connected to the collector terminals of the first and second transistors, respectively, and wherein the base terminal of the third transistor and the emitter terminal of the first transistor and the base terminal of the fourth transistor and the emitter terminal of the second transistor are connected to the clock input for the cell with the clock input for even-numbered cells connected to said second output of said differential amplifier and with the clock input of odd-numbered cells connected to said first output of said differential amplifier.

2. A shift register according to claim 1, wherein said differential amplifier includes a pair of transistors of a second type with their emitter terminals connected in common, a square wave voltage signal applied to their bases, and their collectors connected to respective outputs for providing said first shift clock and said second shift clock.

3. A shift register according to claim 2, wherein each of said differential amplifier transistors have their collector terminals coupled to a reference potential terminal through a respective one of a pair of low-value load resistors in series with a respective one of a pair of diode-connected transistors of the first type, whereby said shift register has a wide frequency range and a neutral temperature response by appropriate selection of the values of the pair of load resistors and the use of said diode-connected transistors.

4. A shift register according to claim 3, further comprising a constant-current source for supplying a constant current Id to the common emitter terminal of the differential amplifier transistors, and first and second bias-current sources for providing a bias current Iv to the respective common collector-base terminals of the diode-connected transistors, wherein the bias-current Iv is less than the constant-current Id by a factor of 10 to 1000.

5. A shift register according to claim 4, wherein the constant-current Id of the constant-current source and the current-bank current Is are selected in accordance with the following relation:

$$4nIs/B \leq Id \leq 10nIs/B,$$

wherein n is the integer number of stages of the shift register chain and B is a DC gain of the diode-connected transistors in a switching mode thereof.

6. A shift register according to claim 1, wherein said current bank includes a fifth transistor and a sixth transistor of a second type coupled in parallel to a supply potential terminal and providing the current-bank current Is to the respective collector terminals of said first and second transistors.

7. A shift register according to claim 1, wherein the second transistor of each latch cell is a dual-emitter transistor having its additional emitter terminal connected to the output stage of the latch cell.

8. Two-phase-controlled shift register in bipolar technology, comprising:
   a clock generator which provides a first shift clock and a second shift clock;
   means for providing a latch clock; and
   an n-stage shift register chain having 2n series-connected cells defined as alternately odd- and even-numbered cells, wherein each cell has a clock input, a pair of input terminals for receiving antiphase data input, and a pair of output terminals for providing antiphase data output, and n latch cells each having a latch-clock input, a pair of input terminals for receiving antiphase data input, and an output stage for providing a data output based upon at least one of said antiphase data input;
   wherein each stage of said n-stage shift register chain is formed by an odd-numbered cell, an even-numbered cell, and a latch cell, the odd-numbered cell having said first shift clock applied to its clock input and its output terminals connected to the input terminals of the even-numbered cell, the even numbered cell having said second shift clock applied to its clock input and its output terminals connected to the input terminals of the latch cell and to the input terminals of the odd-numbered cell of the next stage in sequence of said n-stage shift register chain, and the latch cell having said latch clock applied to its latch-clock input for providing the data output latched therein via its output stage; and wherein each of the odd-numbered, even-numbered, and latch cells of said n stages of said shift register chain is formed by a basic cell circuit including a current bank for providing a current-bank current Is at a pair of output terminals thereof, a first transistor and a second transistor of a first type having their emitter terminals coupled together and each having its collector terminal connected to the base terminal of the respective other transistor and to a respective output terminal of the current bank, and a third transistor and a fourth transistor of the first type having their emitter terminals coupled to the respective pair of input terminals for the cell and their collector terminals connected to the collector terminals of the first and second transistors, respectively, and wherein the base terminal of the third transistor and the emitter terminal of the first transistor and the base terminal of the fourth transistor and the emitter terminal of the second transistor are connected to the clock input for the cell.

9. A shift register according to claim 8, wherein said clock generator includes a differential amplifier having a pair of transistors of a second type with their emitter terminals connected in common, a square wave voltage signal applied to their bases, and their collectors connected to respective outputs for providing said first shift clock and said second shift clock.

10. A shift register according to claim 9, wherein each of said differential amplifier transistors have their collector terminals coupled to a reference potential terminal through a respective one of a pair of low-value load resistors in series with a respective one of a pair of diode-connected transistors of the first type, whereby said shift register has a wide frequency range and a neutral temperature response by appropriate selection of the values of the pair of load resistors and the use of said diode-connected transistors.

11. A shift register according to claim 10, further comprising a constant-current source for supplying a constant current Id to the common emitter terminal of the differential amplifier transistors, and first and second bias-current sources for providing a bias current Iv to the respective common collector-base terminals of the diode-connected transistors, wherein the bias-current Iv is less than the constant-current Id by a factor of 10 to 1000.

12. A shift register according to claim 11, wherein the constant-current Id of the constant-current source and the current-bank current Is are selected in accordance with the following relation:

$$4nIs/B \leq Id \leq 10nIs/B,$$

wherein n is the integer number of stages of the shift register chain and B is a DC gain of the diode-connected transistors in a switching mode thereof.

13. A shift register according to claim 8, wherein said current bank includes a fifth transistor and a sixth transistor of a second type coupled in parallel to a supply potential terminal and providing the current-bank current Is to the respective collector terminals of said first and second transistors.

14. A shift register according to claim 8, wherein each latch cell the second transistor of each latch cell is a dual-emitter transistor having its additional emitter terminal connected to the output stage of the latch cell.

15. A shift register according to claim 14, wherein said output stage of each latch cell includes a seventh transistor of the first type and an eighth transistor of a second type, wherein said seventh transistor has its base terminal connected to the additional emitter of said second transistor, its emitter terminal to the latch-clock input, and its collector terminal to an output terminal of the latch cell, and said eighth transistor has its base terminal connected to a common base lead of the current bank, its emitter terminal to a supply potential terminal, and its collector terminal to the base terminal of said seventh transistor.

16. A shift register according to claim 15, wherein the eighth transistor has a collector current which is about one-fifth of the current-bank current Is.

17. A shift register according to claim 8, wherein the transistors of the first type which go into saturation are laid out in a semiconductor structure having their base regions surrounded by an annular region of $n^+$-type material which is formed as a lateral region into the surface of the collector well and includes the respective contact.

18. A shift register according to claim 11, wherein said constant-current source for the differential amplifier of said clock generator includes a transistor of the second type which has its emitter terminal connected to the supply potential terminal via an emitter resistor, its base terminal connected to the supply potential terminal via a temperature-compensated reference-voltage source, and its collector terminal connected to the common emitter terminal of the differential amplifier.

19. A shift register according to claim 18, further comprising a ninth transistor of the second type having emitter terminal connected to the supply potential terminal, and its base and collector terminals diode-connected in common to a common base lead to the current banks of all cells and to the reference potential terminal through a series resistor.

20. A shift register according to claim 19, wherein said shift register is adapted to different frequencies by selection of said emitter resistor of said clock generator and said series resistor connected to said ninth transistor.

* * * * *